United States Patent
Aihara

(10) Patent No.: US 7,941,234 B2
(45) Date of Patent: May 10, 2011

(54) EXPOSURE APPARATUS AND PARAMETER EDITING METHOD

(75) Inventor: Sentaro Aihara, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 43 days.

(21) Appl. No.: 11/390,436

(22) Filed: Mar. 28, 2006

(65) Prior Publication Data

US 2006/0224269 A1    Oct. 5, 2006

(30) Foreign Application Priority Data

Apr. 1, 2005    (JP) ................... 2005-106786

(51) Int. Cl.
G05B 15/00    (2006.01)
G06F 3/00    (2006.01)

(52) U.S. Cl. ........... 700/83; 700/121; 715/700; 715/765

(58) Field of Classification Search ............... 700/1, 83, 700/90, 95, 117, 121; 715/700, 777, 817, 715/835, 840, 764, 765; 716/21
See application file for complete search history.

(56) References Cited

U.S. PATENT DOCUMENTS

| | | | | |
|---|---|---|---|---|
| 6,665,575 | B2 * | 12/2003 | Betawar et al. | 700/121 |
| 6,721,940 | B2 * | 4/2004 | Miwa et al. | 716/21 |
| 7,239,934 | B2 * | 7/2007 | Morinaga et al. | 700/121 |
| 7,248,936 | B1 * | 7/2007 | Holmes et al. | 700/97 |
| 2003/0061596 | A1 * | 3/2003 | Motoki | 716/21 |

FOREIGN PATENT DOCUMENTS

JP    2000-340500    12/2000

* cited by examiner

Primary Examiner — Kidest Bahta
Assistant Examiner — Sheela Rao
(74) Attorney, Agent, or Firm — Fitzpatrick, Cella, Harper & Scinto

(57) ABSTRACT

An exposure apparatus for exposing a substrate to radiation based on parameters. The apparatus includes a display, an input device, and a processor configured to execute a program for editing the parameters. The processor is configured to cause, in accordance with the program, the display to display a first group of a first classification name for classifying the parameters, a plurality of names of works to be executed by the apparatus, a second group of a second classification name for classifying the parameters, a plurality of names of functions, each of which is contained in at least one of the works, and contents of parameters corresponding to a combination of one of the plurality of names of works of the first classification name and one of the plurality of names of functions of the second classification name, respectively selected by the input device.

9 Claims, 12 Drawing Sheets

EXPOSURE APPARATUS AND PARAMETER EDITING METHOD

FIELD OF THE INVENTION

The present invention relates to, for example, editing of parameters of an exposure apparatus.

BACKGROUND OF THE INVENTION

A general semiconductor exposure apparatus sets, by using parameters, switching of its control method, an offset value, and the contents of a wafer exposure process. The exposure apparatus provides an operator with an editing window (user interface) as a means for setting various parameters. The operator sets these parameters via the editing window.

The editing window associated with apparatus parameters (system parameters) for setting switching of the control method and the offset value uses different parameters as editing targets, depending on the type of works using the exposure apparatus. Therefore, the parameters are classified for the respective works. In the individual works, the parameters are further classified for a plurality of functions because of the necessity of setting for the functions.

In order to edit the system parameters with the above structure, a conventional system parameter editing window has a hierarchical structure in which the individual works are defined as a parent window of an upper level, and a function contained in each work is defined as a child window of a lower level.

In many cases, recipe parameters as the contents of the wafer exposure process have a value common among recipes used for the same device. However, in a conventional recipe parameter editing window, the individual recipes can be edited only separately (Japanese Patent Laid-Open No. 2000-340500).

If the system parameter editing window has the hierarchical structure in which works are defined as parents and functions are defined as children, window transition passes from the work to the function. However, after the window is changed to a function, which belongs to a certain work, to change the window to a function of another work, the window must be temporarily returned to the work and changed to the other work. This requires a heavy work load for window transition.

Furthermore, in the recipe parameter editing window, the individual recipes are separately edited. However, a plurality of parameters having the same value among a plurality of recipes used for the same device are present. Therefore, although the parameters have the same value among the recipes, they must be set for the respective recipes. As a result, there is still room for improvement in the conventional recipe editing window.

SUMMARY OF THE INVENTION

The present invention has been made in consideration of the above background, and has as its exemplary object to provide a novel technique associated with editing of parameters of an exposure apparatus.

In order to solve the above problems and to achieve the above object, according to the first aspect of the present invention, there is provided an exposure apparatus for exposing a substrate to radiation based on parameters, the apparatus comprising a display, an input device, and a processor configured to execute a program for editing the parameters, wherein the processor is configured to cause, in accordance with the program, the display to display a first group of a first classification name for classifying the parameters, a second group of a second classification name for classifying the parameters, and contents of parameters corresponding to a combination of the first classification name and the second classification name selected by the input device.

There is also provided a method of editing parameters of an exposure apparatus, the exposure apparatus exposing a substrate to radiation based on the parameters, the method comprising steps of causing a display to display a first group of a first classification name for classifying the parameters and a second group of a second classification name for classifying the parameters, and causing the display to display contents of parameters corresponding to a combination of the first classification name and the second classification name selected by an input device.

According to the second aspect of the present invention, there is provided an exposure apparatus for exposing a substrate to radiation based on parameters, the apparatus comprising a display, an input device, and a processor configured to execute a program for editing the parameters, wherein the processor is configured to cause, in accordance with the program, the display to display, with respect to a first recipe to be executed by the apparatus, a content of a first parameter and a name of a group of a second parameter that is different from the first parameter, and configured to set, with respect to a second recipe that is different from the first recipe, a content of the group of the second parameter based on the name designated by the input device.

There is also provided a method of editing parameters of an exposure apparatus, the exposure apparatus exposing a substrate to radiation based on the parameters, and the method comprising steps of causing a display to display, with respect to a first recipe to be executed by the apparatus, a content of a first parameter and a name of a group of a second parameter that is different from the first parameter and setting, with respect to a second recipe that is different from the first recipe, a content of the group of the second parameter based on the name designated by an input device.

The present invention is also implemented as a device manufacturing method of manufacturing a semiconductor device using the parameter editing method or exposure apparatus corresponding to the first and second aspects.

The present invention can, for example, efficiently edit parameters of an exposure apparatus.

Other objects and advantages besides those discussed above shall be apparent to those skilled in the art from the description of a preferred embodiment of the invention as follows. In the description, reference is made to the accompanying drawings, which form a part thereof, and which illustrate an example of the invention. Such an example, however, is not exhaustive of the various embodiments of the invention, and, therefore, reference is made to the claims which follow the description for determining the scope of the invention.

DETAILED DESCRIPTION OF THE PREFERRED EMBODIMENTS

Preferred embodiments of the present invention will be described below in detail with reference to the accompanying drawings.

Note that the embodiments to be described hereinafter are examples as implementing means of the present invention, and can be appropriately modified or changed in accordance with various conditions and the structure of an apparatus to which the present invention is applied. For example, the present invention is not limited to the arrangements of the embodiments to be described later, and includes a combination of feature points of the first and second embodiments.

Moreover, the present invention can also be practiced by supplying software (e.g., program codes) or a storage medium (or recording medium), which stores the software for implementing a method, such as a parameter editing method or a device manufacturing method according to the embodiments to be described later, to a system or an apparatus, and causing the computer (or CPU or MPU) of the system or apparatus to read out and execute the program codes.

The program codes themselves, which are installed to implement the functional processes of the present invention in the computer also implement the present invention. That is, the computer program itself, which implements the functional processes of the present invention may also be incorporated in the present invention.

In this case, the program can take any form such as an object code, a program to be executed by an interpreter, or script data to be supplied to the operating system (OS), as long as the functions of the program can be obtained.

As the recording medium to supply the program, for example, a floppy disk, a hard disk, an optical disk, a magnetooptical disk, an MO, a CD ROM, a CD R, a CD RW, a magnetic tape, a nonvolatile memory card, a ROM, or a DVD (DVD ROM or DVD R) can be used.

First Embodiment

Figure 1:
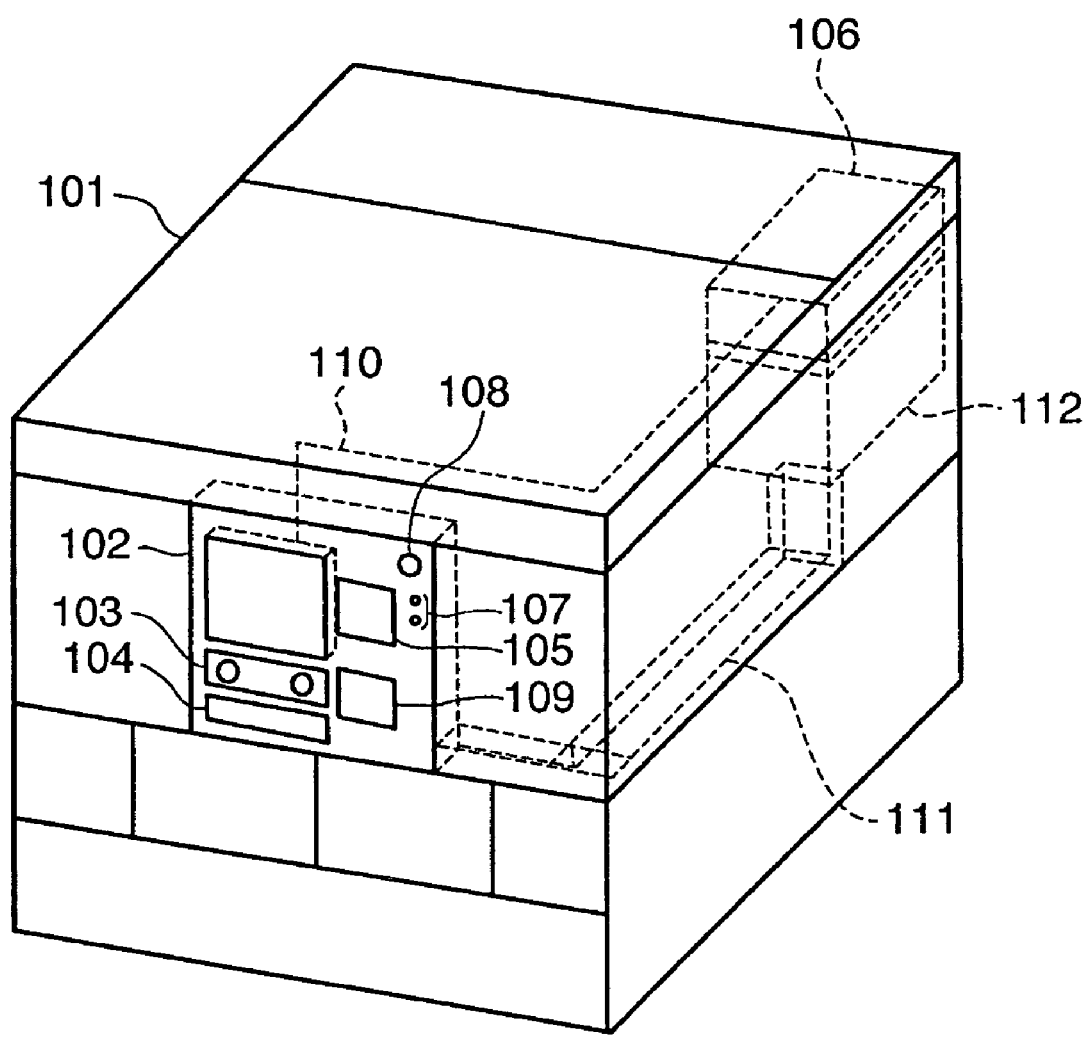
FIG. 1 is a perspective view showing the outer appearance of a semiconductor exposure apparatus according to an embodiment of the present invention.

FIG. 1 is a perspective view showing the outer appearance of a semiconductor exposure apparatus according to an embodiment of the present invention.

As shown in FIG. 1, the semiconductor exposure apparatus comprises a temperature regulating chamber 101, EWS (Engineering Workstation) main body 106, and a console unit. The temperature regulating chamber 101 accommodates the apparatus main body and controls the temperature of its internal environment. The EWS main body 106 is arranged in the chamber 101 and includes a CPU, which controls the apparatus main body. The console unit includes an EWS display 102, a TV monitor 105, an operation panel 103, and an input device 104, such as an EWS keyboard. The EWS display 102 displays predetermined information about the apparatus. The TV monitor 105 displays image information obtained via an image sensing means in the apparatus main body. The operation panel 103 allows the operator to execute a predetermined input operation to the apparatus main body. In FIG. 1, reference numeral 107 denotes an ON/OFF switch; 108, an emergency stop switch; 109, various switches, a mouse, and the like; 110, a LAN communication cable; 111, an exhaust duct, which removes heat from the console functions; and 112, an evacuation device of the chamber 101.

The EWS display 102 is of a flat type, such as an EL, plasma, or liquid crystal. The EWS display 102 is accommodated in the front surface of the chamber 101 and connected to the EWS main body 106 via the LAN communication cable 110. The operation panel 103, keyboard 104, and TV monitor 105 are also attached to the front surface of the chamber 101 so as to allow the operator to execute various operations from the front surface of the chamber 101 via the console unit, similar to the conventional one.

Figure 2:
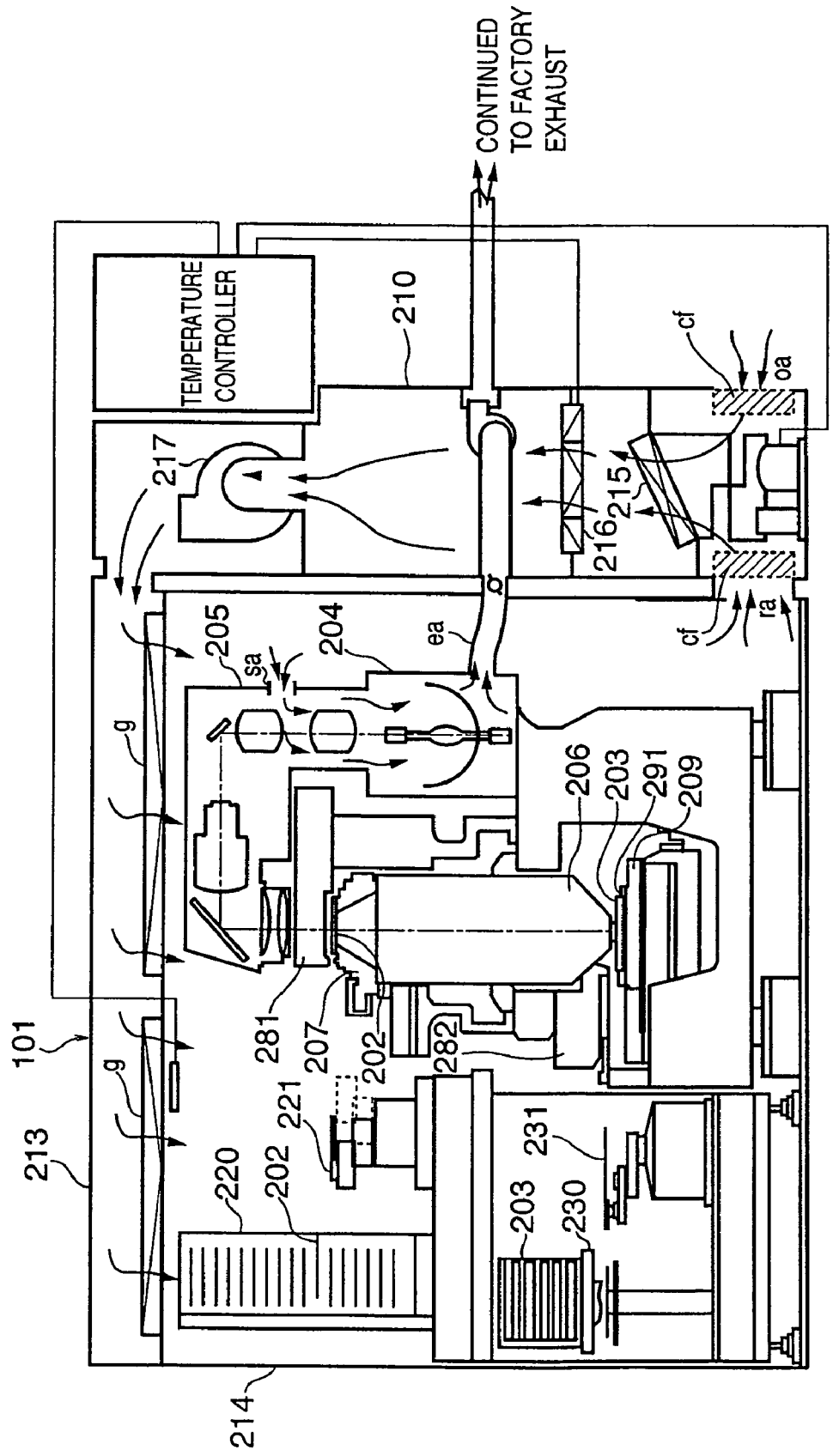
FIG. 2 is a view showing the internal structure of the apparatus in FIG. 1.

FIG. 2 is a view showing the internal structure of the apparatus shown in FIG. 1.

Referring to FIG. 2, a stepper, as the semiconductor exposure apparatus, is shown. In FIG. 2, reference numeral 202 denotes a reticle; and 203, a wafer. When a light beam emitted from a light source device 204 passes through an illumination optical system 205 and illuminates the reticle 202, a pattern on the reticle 202 can be transferred onto a photosensitive layer on the wafer 203 through a projection lens or projection optical system 206. The reticle 202 is supported by a reticle stage 207 for holding and moving the reticle 202. The wafer 203 is exposed while being chucked by vacuum suction using a wafer chuck 291. The wafer chuck 291 can be moved in the direction of each axis by a wafer stage 209. A reticle optical system 281 for detecting the position shift amount of the reticle is arranged above the reticle 202. An off-axis microscope 282 is arranged adjacent to the projection lens or projection optical system 206 above the wafer stage 209. The off-axis microscope 282 mainly serves to detect the relative position between a reference mark in the main body and an alignment mark on the wafer 203. A reticle library 220 and wafer carrier elevator 230, as peripheral devices, are arranged adjacent to the stepper main body, including the above components. A target reticle and wafer are transported to the stepper main body by a reticle transport device 221 and wafer transport device 231, respectively.

The chamber 101 includes an air conditioner room 210, a filter box 213, and a booth 214. The air conditioner room 210 mainly regulates the temperature of air. The filter box 213 filters out fine particles to form a uniform flow of clean air. The booth 214 shuts off the apparatus environment from the outside. In the chamber 101, the air whose temperature is regulated by a cooler 215 and reheater 216 in the air conditioner room 210 is supplied to the booth 214 by a blower 217 through an air filter g. The air supplied to the booth 214 is recovered from a return port ra into the air conditioner room 210, and circulates in the chamber 101. Strictly speaking, the chamber 101 is not normally a complete circulation system. To always maintain the booth 214 at a positive pressure, 10% of air in the circulating air amount is externally introduced, through the blower, from an outside gas introduction port oa formed in the air conditioner room 210.

In this manner, the chamber 101, which accommodates the apparatus main body, can keep its internal environment at a constant temperature and the air clean. An air supply port sa and an exhaust port ea are prepared for the light source device 204 against a poisonous gas produced upon cooling a very-high-pressure mercury-vapor lamp or laser abnormality. Part of the air in the booth 214 passes through the light source device 204 and is forcibly exhausted to factory equipment through a dedicated exhaust fan provided in the air conditioner room 210. Also, chemisorption filters cf for removing chemicals in the air are connected to the outside gas introduction port oa and return port ra of the air conditioner room 210.

Figure 3:
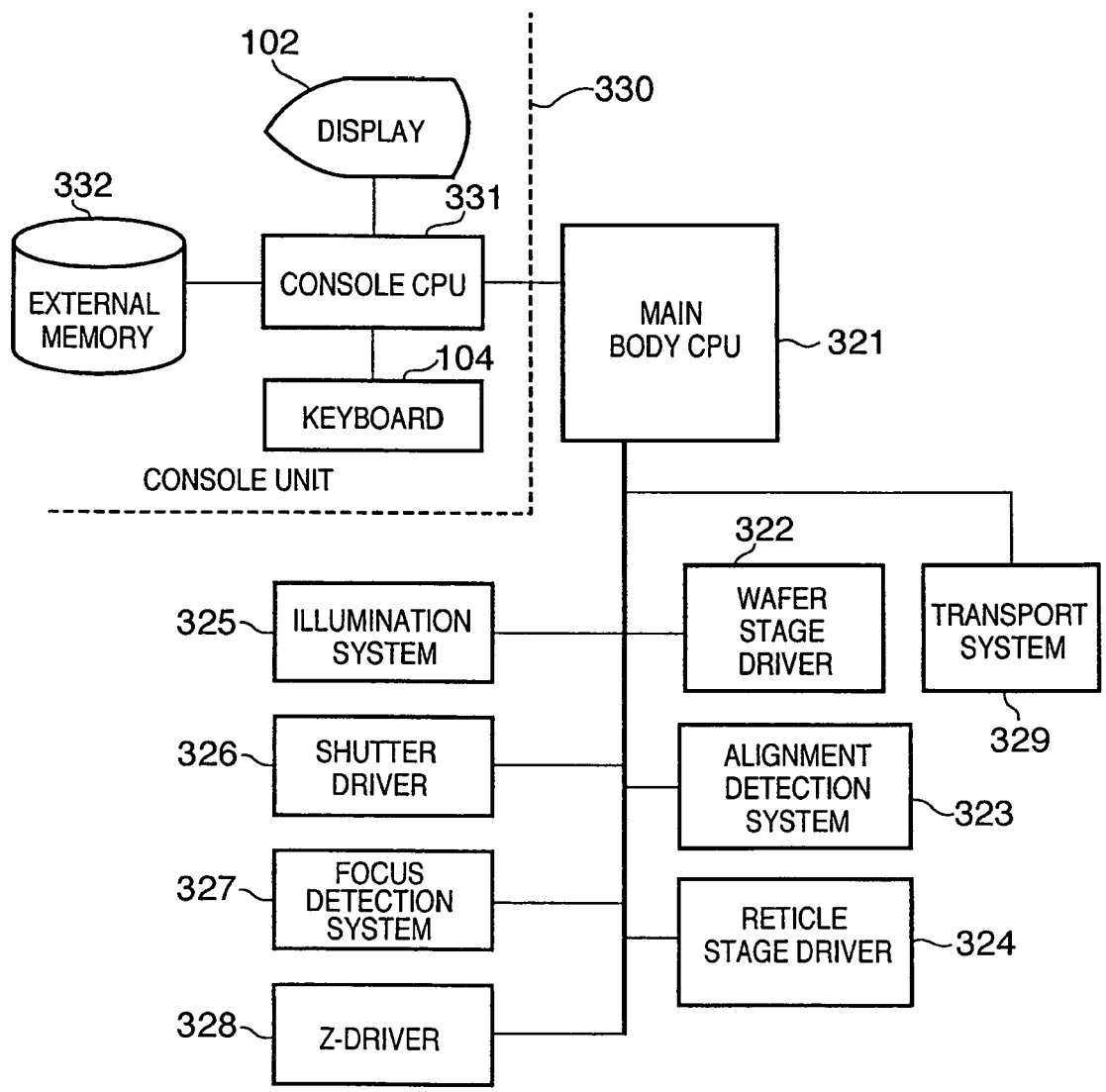
FIG. 3 is a block diagram showing the electrical circuit configuration of the apparatus shown in FIG. 1.

FIG. 3 is a block diagram showing the electrical circuit configuration of the apparatus shown in FIG. 1.

Referring to FIG. 3, a main body CPU 321, which is incorporated in the EWS main body 106 and controls the overall apparatus, is constituted by a central processing unit, such as a microcomputer or minicomputer. Reference numeral 322 denotes a wafer stage driver; 323, an alignment detection system constituted by the off-axis microscope 282; 324, a reticle stage driver; 325, an illumination system such as the light source device 204; 326, a shutter driver; 327, a focus detection system; and 328, a Z-driver. These components are controlled by the CPU main body 321. Reference numeral 329 denotes a transport system, such as the reticle transport device 221 or wafer transport device 231. A console unit 330 having the display 102 and keyboard 104 gives various commands and parameters associated with the operation of the exposure apparatus to the main body CPU 321. That is, the console unit 330 exchanges information with the operator. Reference numeral 331 denotes a console CPU; and 332, an external memory. The external memory 332 is, e.g., a hard disk. The external memory 332 has a built-in database, which records various parameters, data for managing them, and the operator's group.

This embodiment exemplifies a mode in which a parameter editor as a characteristic feature of the present invention is realized. An example in which various parameters of the exposure apparatus, which are stored in the external memory 332, are changed, will be described hereinafter.

Figure 4:
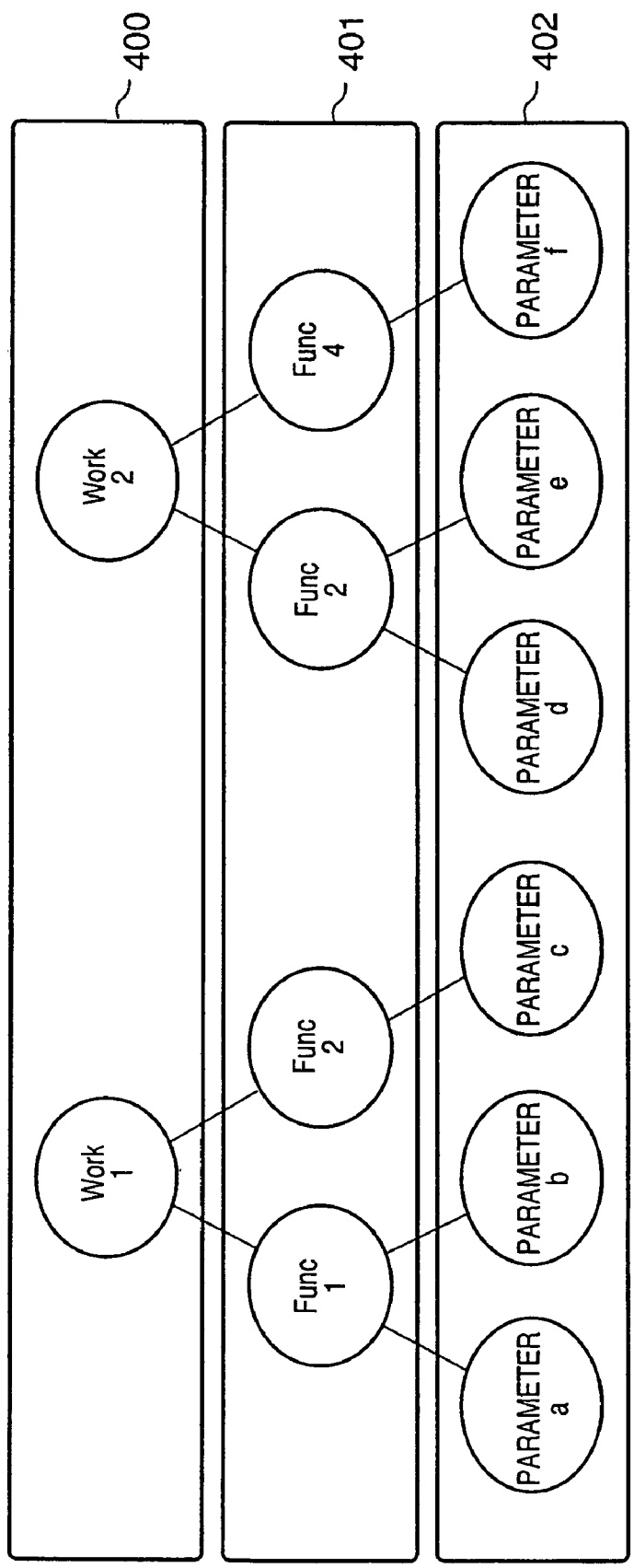
FIG. 4 is a conceptual view showing the structure of system parameters used for the apparatus in FIG. 1.

FIG. 4 is a view showing the outline of the structure of system parameters of the exposure apparatus, which are stored in the external memory 332. The system parameters form a hierarchical tree structure in which a lower layer belongs to an upper layer. An upper layer 400 is a work layer and comprises individual works as constituent elements. An intermediate layer 401 lower than the upper layer 400 is a function layer and comprises individual functions as constituent elements. A lower layer 402 lower than the intermediate layer 401 is a parameter layer and comprises individual parameters as constituent elements. The elements of the function layer 401 may belong to elements of a plurality of work layers 400. FIG. 4 represents that a function Func 2 belongs to works Work 1 and Work 2.

Figure 5:
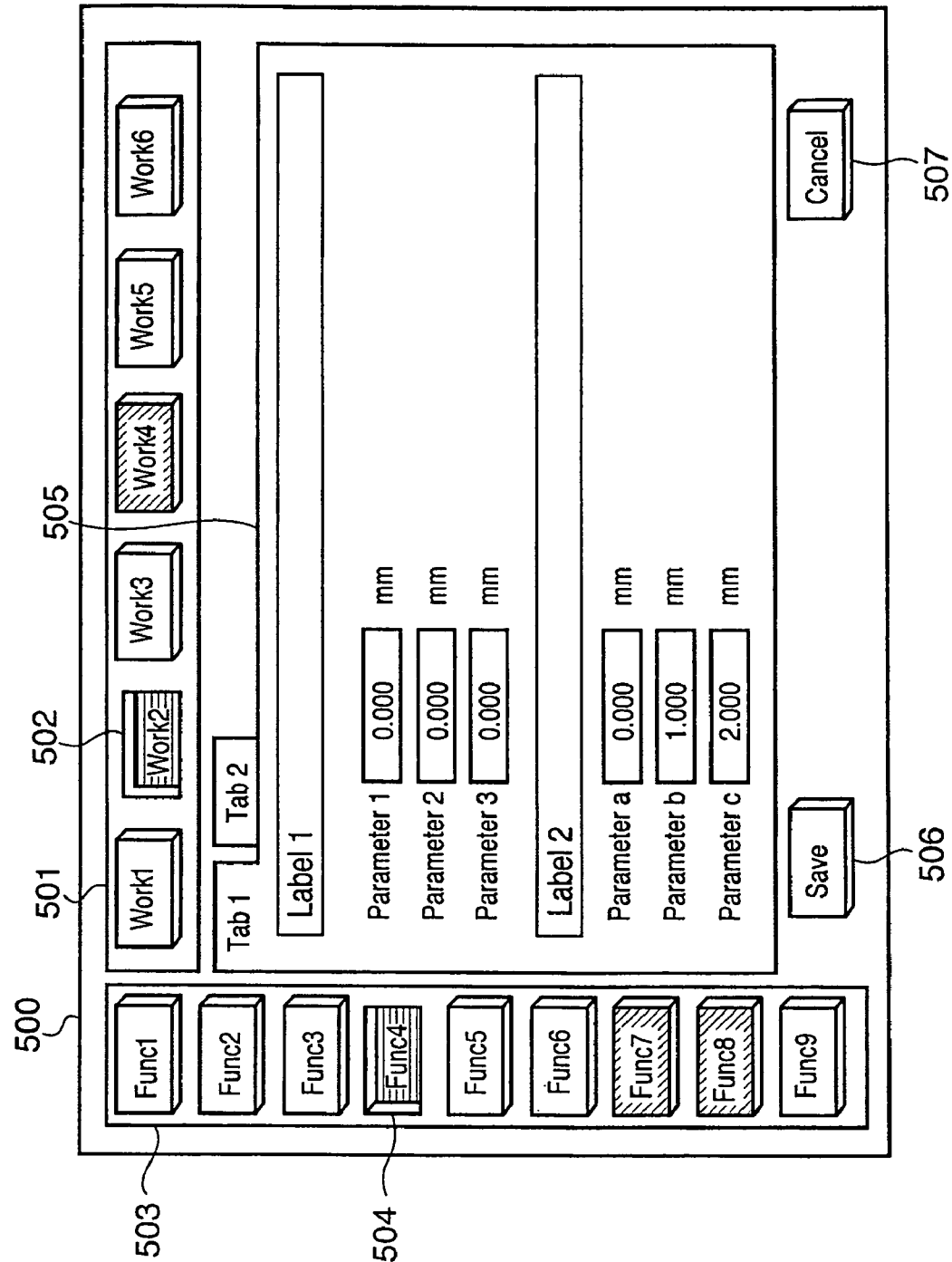
FIG. 5 is a view showing a display example of a system parameter editor in the apparatus of FIG. 1.

FIG. 5 is a view exemplifying a system parameter editor 500, which serves as an editing tool (user interface) displayed on the display 102 in FIG. 1, and edits the system parameters of the exposure apparatus, which are stored in the external memory 332. Programs (editor programs) associated with editing are executed by, e.g., the console CPU 331. The system parameter editor 500 comprises a work button display area 501, function button display area 503, parameter editing area 505, editing save button 506, and editing cancel button 507.

Work switching buttons (work names) 502, corresponding to the work elements contained in the work layer 400 of FIG. 4, are arranged in the work button display area 501. Function switching buttons (function names) 504 corresponding to the function elements contained in the function layer 401 of FIG. 4 are arranged in the function button display area 503. The individual parameters contained in the lower layer 402 of FIG. 4 are arranged in the parameter editing area 505 to provide a means for editing the parameters. The editing save button 506 provides a means for reflecting, in the external memory 332, a change in parameter value executed in the parameter editing area 505. The editing cancel button 507 provides a means for canceling a change in parameter value executed in the parameter editing area 505.

In the system parameter editor 500, the work switching buttons 502 displayed in the work button display area 501, and the function switching buttons 504 displayed in the function button display area 503, are arranged in a matrix, i.e., horizontally and vertically. A parameter, which belongs to a selected work switching button 502 and function switching button 504, is displayed in the parameter editing area 505. In the system parameter editor 500 of FIG. 5, the work Work 2 is selected as the work switching button 502, and a function Func 4 is selected as the function switching button 504, so a parameter which belongs to the work Work 2 and function Func 4 is displayed in the parameter editing area 505. This amounts to displaying a parameter fin the lower layer 402, which belongs to the work Work 2 in the work layer 400 and belongs to the function Func 4 in the function layer 401.

As described above, in the system parameter editor 500, the work switching buttons 502 and function switching buttons 504 are listed and displayed in the matrix. Only by selecting a work switching button 502 or function switching button 504 desired to be displayed, a corresponding parameter is displayed in the parameter display area 505. This makes it possible to facilitate window transition.

As indicated by the structure of the system parameters in FIG. 4, in the function layer 401, some functions belong to a specific one of the respective work elements in the work layer 400 and others do not. Therefore, in the system parameter editor 500, function switching buttons (Func 7 and Func 8), which do not belong to a selected work switching button 502, are displayed using a color or pattern different from that of function switching buttons 504, which belong to the selected work, so that the operator is allowed to easily determine whether a function of interest belongs to a work element. In the same manner, some works in the work layer 400 contain a specific function in the function layer 401 and others do not. For this reason, work switching buttons (Work 4) to which a selected function switching button 504 does not belong are displayed using a color or pattern different from that of work switching buttons 502 to which the selected function switching button 504 belongs. In the system parameter editor 500, buttons of functions Func 7 and Func 8 in the function switching buttons 504 have a different color and pattern while the work Work 2 is being selected as the work switching button 502. This represents that the functions Func 7 and Func 8 do not belong to the work Work 2.

The parameter display area 505 has a tab structure in the system parameter editor 500. Also, parameters in one tab are further classified into labels. With such a display structure, the operator can effectively grasp parameters even when the number of parameters displayed in the parameter editing area 505 is large.

Figure 6:
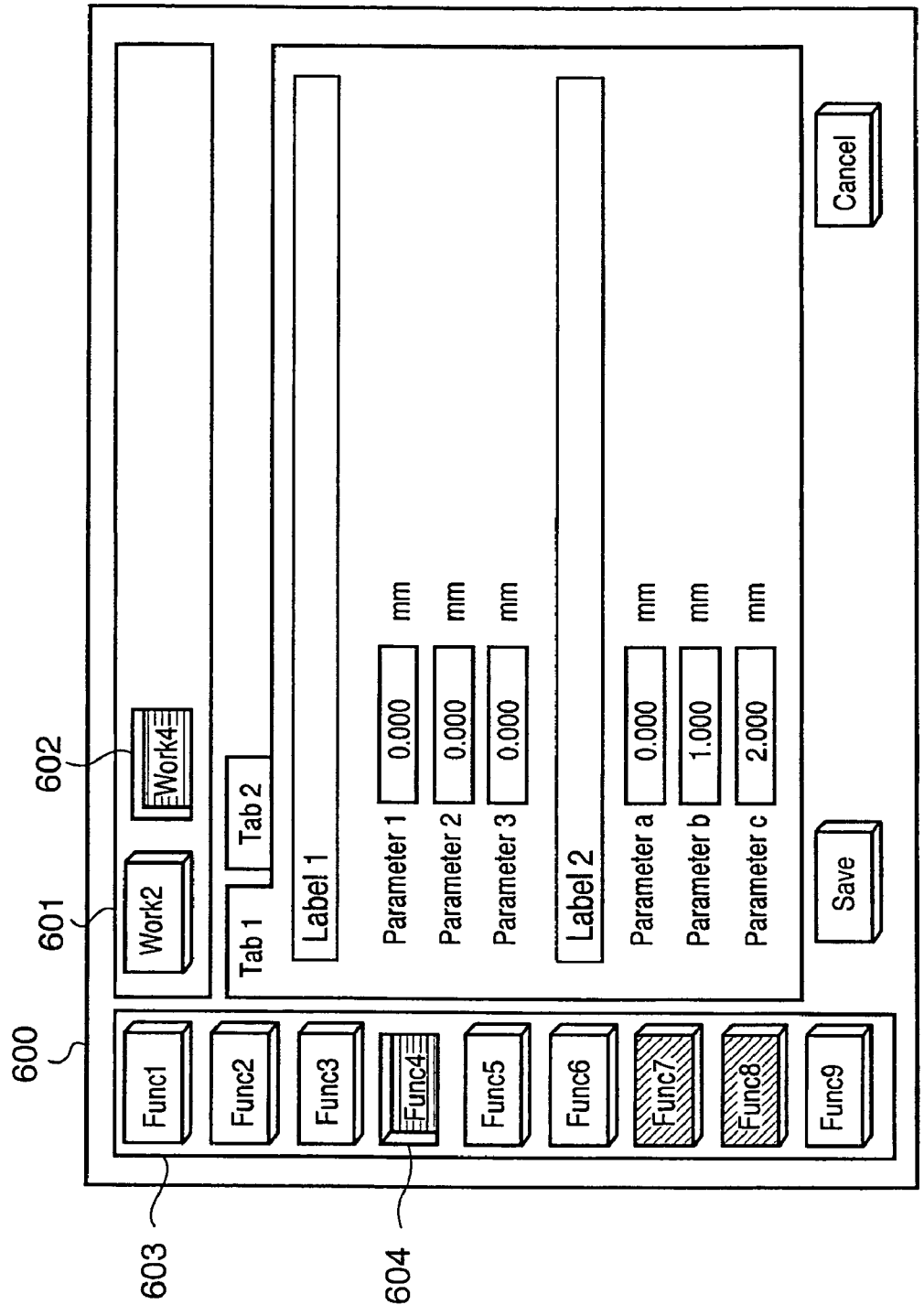
FIG. 6 is a view showing a system parameter editor when some works are not allowed to be edited in accordance with the operator's authority.

In the system parameter editor 500, when the work switching buttons 502 are manipulated to select arbitrary work elements, it is possible to edit parameters, which belong to arbitrary work elements. In fact, however, editable works are limited in accordance with the authority of the operator using the apparatus. FIG. 6 is a view showing a system parameter editor 600 when editable works are limited in accordance with the operator's authority. The system parameter editor 600 represents the state in which the operator having authority to edit only the work Work 2 and a work Work 4 manipulates the editing window. In a work button display area 601 of the system parameter editor 600, only work switching buttons 602 (and function switching buttons 604, which belong to work elements for which the operator has editing authority) corresponding to the work elements, are displayed to be selectable (that is, selection and edition for which the operator has no authority are prohibited). As described above, in the system parameter editor 600, switching whether to display the work switching buttons 602 in synchronism with the operator's authority makes it possible to prevent the operator from editing parameters for which the operator has no authority to do so.

In the window of FIG. 6, buttons for selecting information for which the operator has no editing authority need not necessarily be displayed.

According to this embodiment, system parameters can be efficiently edited, thus shortening the editing operation time. In particular, such an effect becomes conspicuous when system parameters are edited, while referring to a plurality of work windows or function windows.

Second Embodiment

The first embodiment serves as a means for efficiently editing system parameters. To the contrary, the second embodiment, serving as a means for efficiently editing recipe parameters, will be described below.

Figure 7:
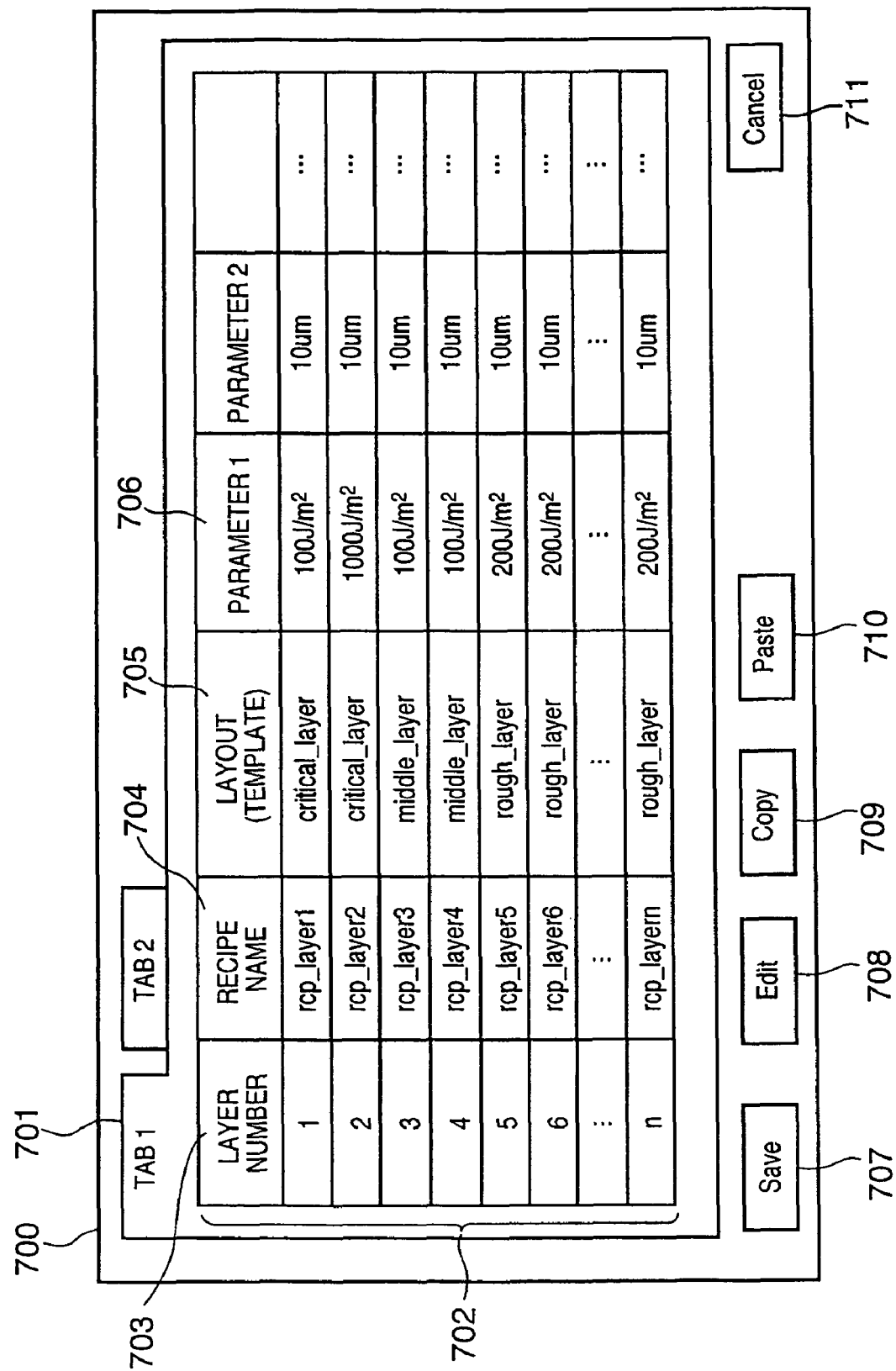
FIG. 7 is a view showing a display example of a recipe parameter editor in the apparatus of FIG. 1.

FIG. 7 is a view showing a recipe parameter editor 700, which serves as an editing tool to be displayed on the display 102 in FIG. 1, and edits recipes of an exposure apparatus for each device, which are stored in an external memory 332.

The layer editor 700 includes a recipe list 702, editing save button 707, parameter editing button 708, parameter copy button 709, parameter paste button 710, and editing cancel button 711. The recipe list 702 lists recipes contained in a device. Each row of the recipe list 702 represents a recipe for one layer of the device. The recipe list is displayed in the order of a hierarchy of layers. A number 703, recipe name 704, and various parameters, which serve as recipe parameters for the layer, are displayed in each row of the recipe list 702. The number 703 represents the order of the hierarchy in the device. If the recipe list 702 has a large number of parameters contained in recipes, it can be divided into a plurality of lists, and a display portion of the recipe list 702 can be switched by a tab 701. With this arrangement, the recipe of the device can be listed for each hierarchy, thus allowing the operator to easily grasp setting contents.

Recipe parameters form a parameter set which characterizes the recipe. The parameter set often takes a value common in a device. The parameter set that is common in the device is defined as a template so as to set it into the recipe. Using the template makes it possible to set a plurality of parameters to the same value over a plurality of recipes.

A layout item 705 displayed in the recipe list 702 displays a template of a shot layout set in a recipe. The shot layout is formed from a plurality of parameters, such as the size or arrangement information of the exposure shot. The set of parameters is a template, which characterizes the layout.

Figure 8:
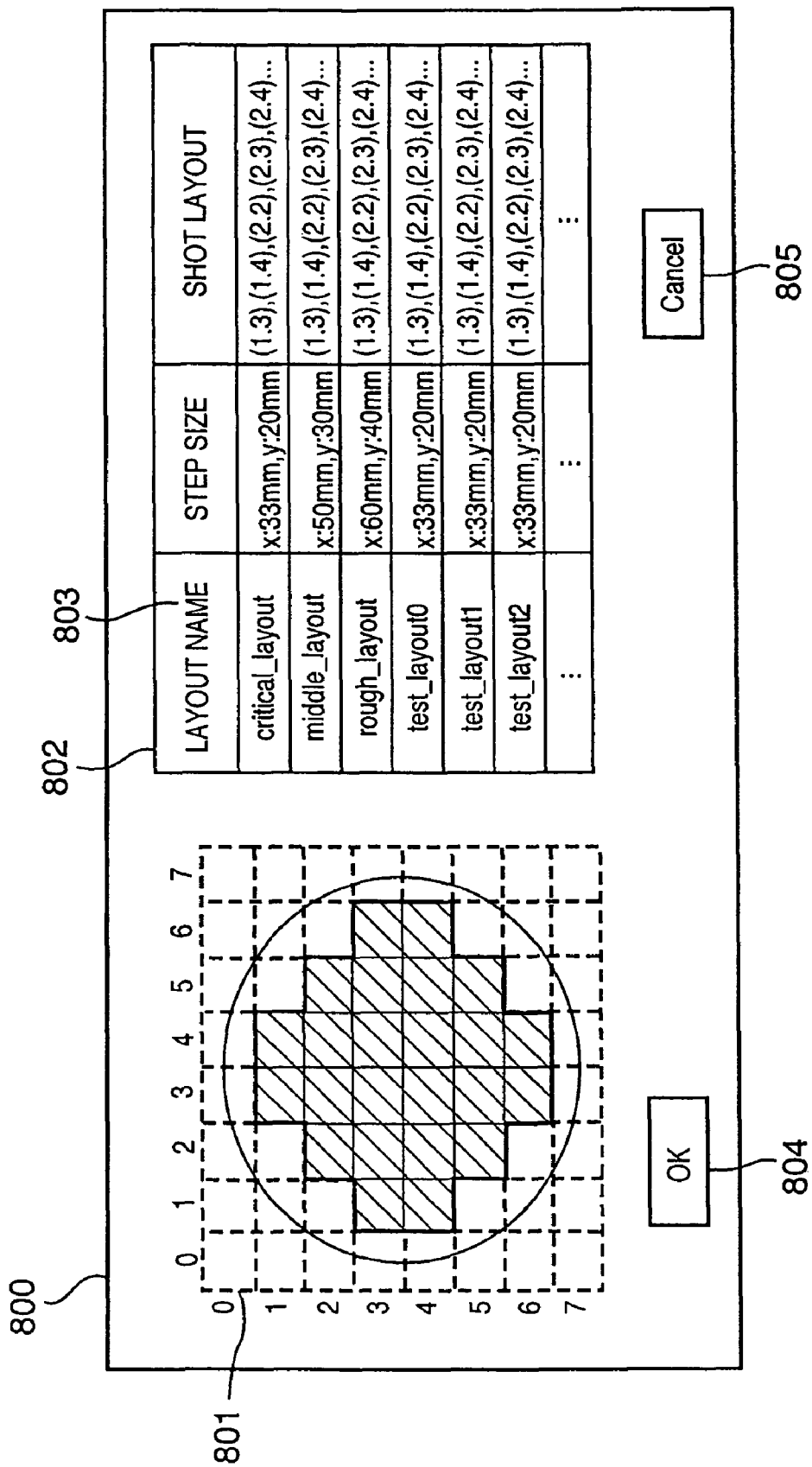
FIG. 8 is a view representing a display example of a window to select templates to be set into recipe parameters.

FIG. 8 is a view representing a layout template selection window 800, which lists choices of layout templates to be set into recipes. Selectable layout templates are displayed in a layout template list 802. Each layout template is formed, using a layout name 803 as a key item, from a plurality of parameters, such as the step size or shot arrangement information, thereby forming a layout. A layout viewer 801 displays an image of the layout selected in the layout template list 802.

A means for setting a layout template into a layout template item in the recipe list 702 of FIG. 7 is as follows. When the Edit button 708 is pressed, after the layout template item 705 of a recipe as an editing target is selected, the layout template selection window 800 in FIG. 8 is activated. In the layout template list 802 of the layout template selection window 800, the selected template is stored as a setting target in the recipe. When an OK button 804 is pressed, the layout template selection window 800 is ended. The template selected in the layout template selection window 800 is set into the layout item 705 as the selection target. As described above, using the means for setting a template as a set of a plurality of parameters makes it possible to easily set a template common among a plurality of recipes, thus improving the efficiency of recipe edition.

Figure 9:
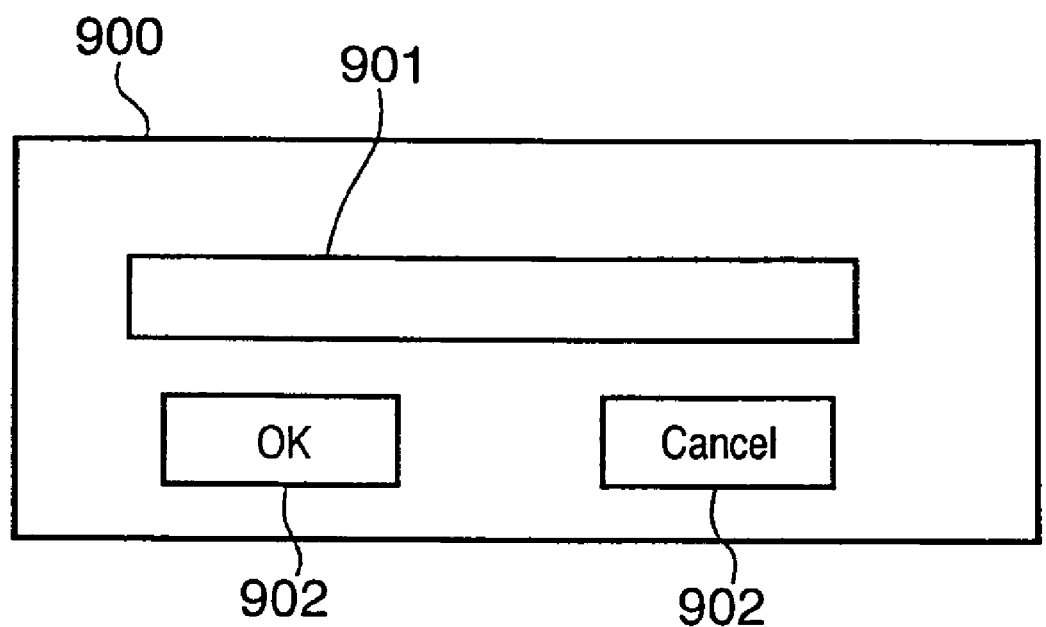
FIG. 9 is a view showing a display example of a window to input a value to a recipe parameter.

A means for setting a value into a parameter item 706, other than templates in the recipe list 702, is as follows. When the Edit button 708 is pressed after the parameter item 706 of a recipe as an editing target is selected, a parameter value input window 900 in FIG. 9 is activated. An input value is stored in a value input area 901 of the parameter value input window 900. When an OK button 902 is pressed, the parameter value input window 900 is ended. The value input in the value input area 901 is set into the parameter item 706 as the selection target.

The layer editor 700 in FIG. 7 also has a means for copying a parameter among recipes. An arbitrary item corresponding to an arbitrary recipe in the recipe list 702 can be selected. When the Copy button 709 is pressed, the value of the selected item is stored. After that, a recipe item in the same row as that of a copy source is selected in the recipe list 702 and stored as a copy destination. When the Paste button 710 is pressed, the value of the copy source is reflected in the copy destination. In this manner, a specific recipe parameter can be copied while taking a look at recipe parameters contained in a device. Therefore, a common value can be readily reflected in recipes having a large number of common values, while comparing the setting states of the respective recipes.

Figure 10:
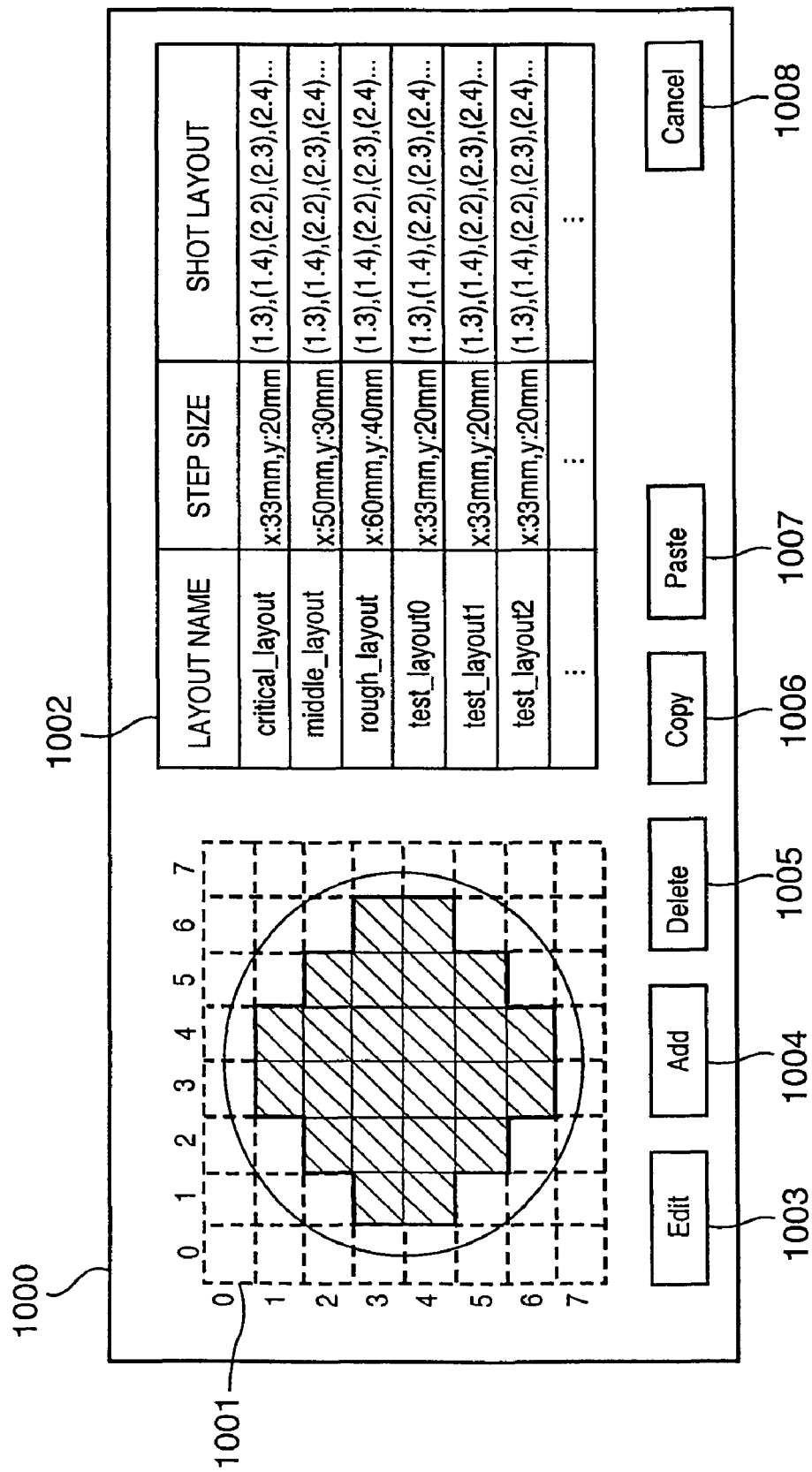
FIG. 10 is a view representing the displayed structure of a template editing window.

FIG. 10 is a view representing a layout template editing window 1000 to edit layout templates. The layout template editing window 1000 includes a layout template list 1002, layout viewer 1001, Edit button 1003, Add button 1004, Delete button 1005, Copy button 1006, Paste button 1007, and Cancel button 1008. The layout template list 1002 displays registered templates. The layout viewer 1001 displays a layout image of the templates. The Edit button 1003 is used to edit parameters of the templates. The Add button 1004 is used to newly add a template. The Delete button 1005 is used to delete a registered template. The Copy button 1006 is used to store a template of a copy source. The Paste button 1007 is used to add, as a new template, the template of the copy source. The Cancel button 1008 is used to end the layout template editing window 1000.

In the layout template list 1002, each row represents one template. A template created and edited in the layout template editing window 1000 is displayed in the layout template selection window 800. Moreover, in the layout template editing window 1000, when a template, which has already been set in a recipe is to be edited, a change in template is reflected in the recipe. At this time, a template change is confirmed for each recipe whose template is referenced. For example, the number of shots necessary for wafer position alignment is designated in the recipe. When the number of shots does not reach the required number upon re-editing the template, a warning window is activated to call the operator's attention. In this manner, even when a template is being referred to by a recipe, a change in template can be collectively reflected in the referred recipe, thus realizing efficient editing.

According to this embodiment, recipe parameters can be efficiently edited, thus shortening the editing operation time. In particular, in editing recipe parameters, such an effect becomes conspicuous when recipe parameters are created for a device formed from multiple layers.

[Device Manufacturing Method]

Figure 11:
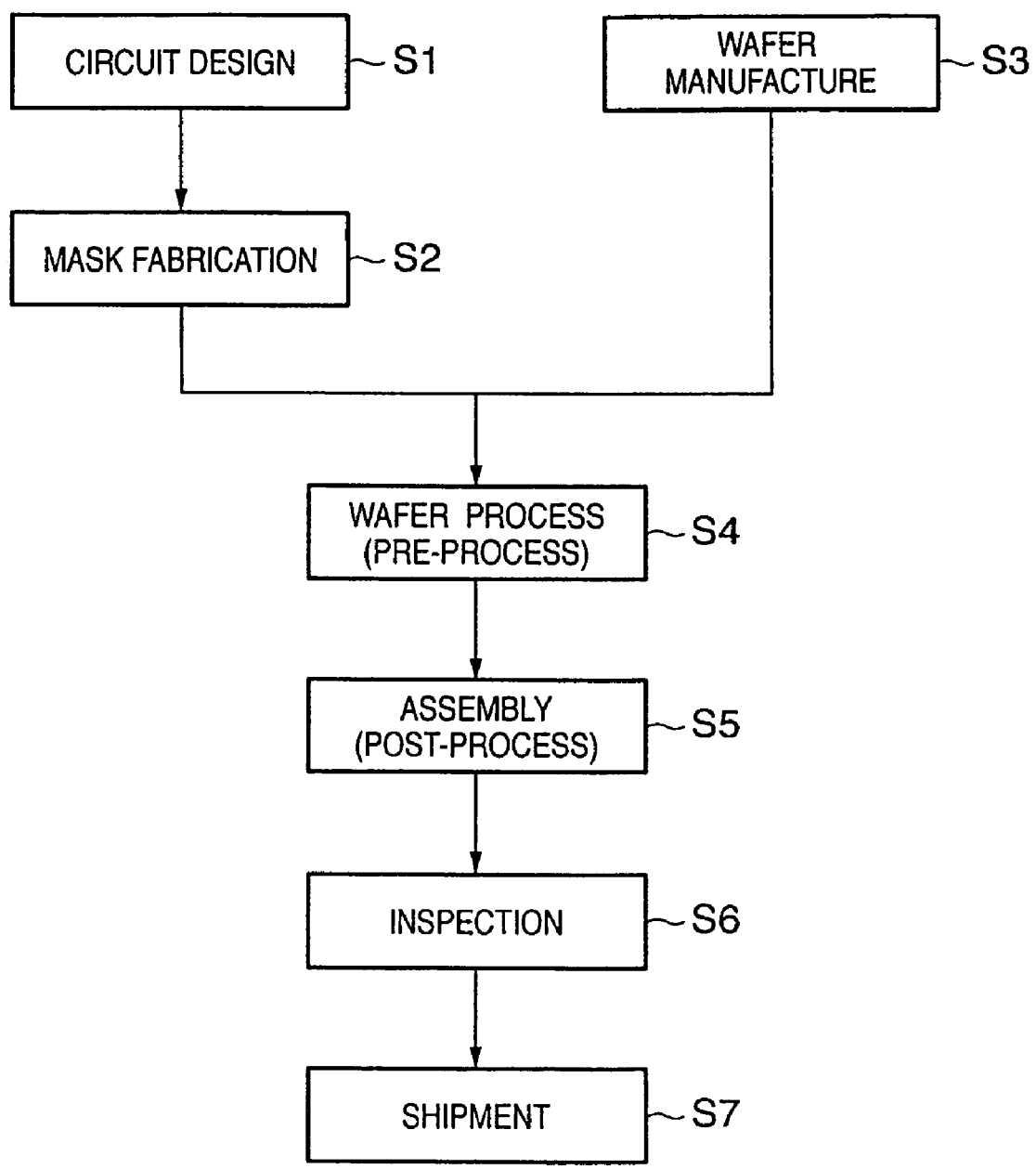
FIG. 11 is a flowchart for explaining a device manufacturing method using the exposure apparatus according to the embodiment.

A semiconductor device manufacturing method using the exposure apparatus discussed above will be described next, with reference to FIGS. 11 and 12. FIG. 11 is a flowchart for explaining the manufacture of a device (e.g., a semiconductor chip, such as an IC or LSI, an LCD, or a CCD). The semiconductor chip manufacture will be exemplified here. In step S1 (circuit design), a device is designed. In step S2 (mask fabrication), a mask (also called a reticle), on which the designed circuit pattern is formed, is fabricated. In step S3 (wafer manufacture), a wafer (also called a substrate) is manufactured using a material such as silicon. In step S4 (wafer process), called a pre-process, an actual circuit is formed on the wafer by lithography using the mask and wafer. In step S5 (assembly), called a post-process, a semiconductor chip is formed using the wafer manufactured in step S4. This step includes an assembly step (dicing and bonding) and a packaging step (chip encapsulation). In step S6 (inspection), the semiconductor device manufactured in step S5 undergoes inspections such as an operation confirmation test and a durability test. After these steps, the semiconductor device is completed and shipped (step S7).

Figure 12:
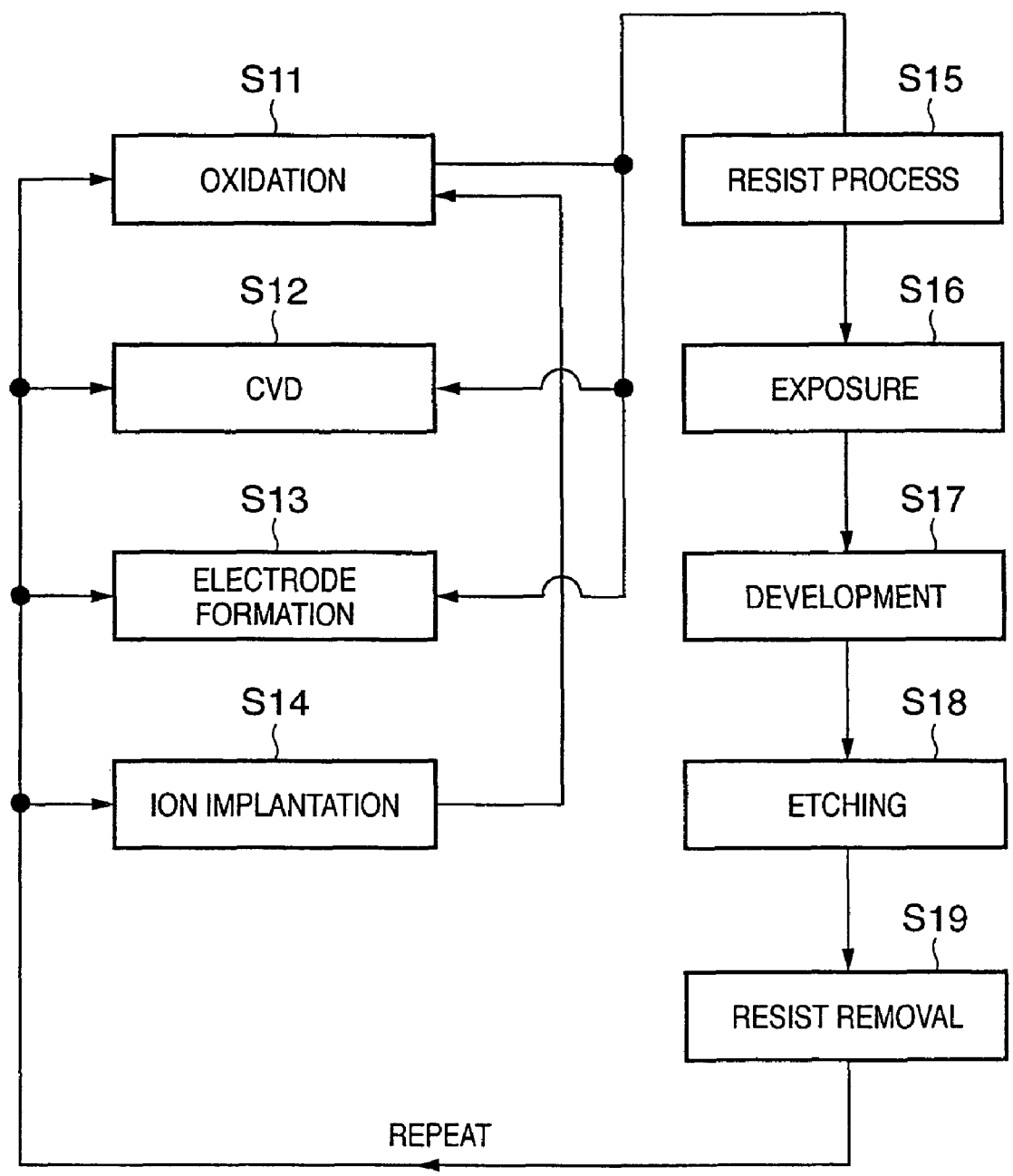
FIG. 12 is a flowchart showing details of step S4 shown in FIG. 11.

FIG. 12 is a flowchart showing details of the wafer process in step S4 shown in FIG. 11. In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist process), a photosensitive agent is applied to the wafer. In step 16 (exposure), the wafer is exposed, using the exposure apparatus, to radiation, via the mask, on which the circuit pattern is formed. In step 17 (development), the exposed wafer is developed. In step 18 (etching), portions other than the developed resist image are etched. In step 19 (resist removal), any unnecessary resist remaining after etching is removed. By repeating these steps, a multilayered structure of circuit patterns is formed on the wafer.

A device manufacturing method which achieves an effect similar to that of the exposure apparatus discussed above is also applied to devices themselves, serving as an intermediate and a final product. Such devices include a semiconductor chip, such as an LSI or VLSI, a CCD, an LCD, a magnetic sensor, and a thin film magnetic head. Also, the radiation used by the exposure apparatus discussed above is not limited to light, and includes electromagnetic waves having various wavelengths, and a particle beam, such as an electron beam. Moreover, the exposure apparatus discussed above may directly draw a pattern on a wafer without using a mask.

As many apparently widely different embodiments of the present invention can be made without departing from the spirit and scope thereof, it is to be understood that the invention is not limited to the specific embodiments thereof except as defined in the appended claims.

This application claims the benefit of Japanese Patent Application No. 2005-106786, filed Apr. 1, 2005, which is hereby incorporated by reference herein in its entirety.

What is claimed is:

1. An exposure apparatus for exposing a substrate to radiation based on parameters, said exposure apparatus comprising:
    a display;
    an operation device configured for an operator of said exposure apparatus to execute an input operation to said exposure apparatus; and
    a processor configured to execute a program for (i) selecting, by said operation device, one of a plurality of names of works to be executed by said exposure apparatus, (ii) selecting, by said operation device, one of a plurality of names of functions, each of which is contained in at least one of the works; and (iii) editing the parameters for exposing the substrate which correspond to a combination of the selected one of a plurality of names of works and the selected one of a plurality of names of functions, wherein said processor is configured to cause said display to simultaneously display the plurality of names of works arranged in a first area along one side of a display area of said display, a plurality of names of functions arranged in a second area along another side of said display, the one side being orthogonal to the other side, and contents of the parameters for exposing the substrate, corresponding to the combination of the selected one of the plurality of names of works and the selected one of the plurality of names of the functions, arranged in a third area having two sides along the first and second areas, respectively.

2. An apparatus according to claim 1, wherein said processor is configured to limit, based on information about a user of said exposure apparatus, the names of works to be displayed on said display.

3. An apparatus according to claim 1, wherein said processor is configured to cause said display to display an unselectable combination out of combinations of one of the plurality of names of works and one of the plurality of the names of functions, in a manner that is different from a manner in which a selectable combination out of the combinations is displayed.

4. An exposure apparatus for exposing a substrate to radiation based on parameters, said exposure apparatus comprising:
    a display;
    an operation device configured for an operator of said exposure apparatus to execute an input operation to said exposure apparatus; and
    a processor configured to execute a program for (i) editing a shot layout of a certain recipe, to be executed by said exposure apparatus, in accordance with an indication by said operation device, (ii) editing the parameters for exposing the substrate and (iii) setting a shot layout corresponding to one of a plurality names of shot layouts designated by said operation device, wherein said processor is configured to cause said display to simultaneously display, with respect to the certain recipe to be executed by said exposure apparatus, names of shot layouts of a plurality of recipes, the certain recipe and the plurality of recipes corresponding to a common device to be manufactured via exposures by said exposure apparatus.

5. An apparatus according to claim 4, wherein said processor is configured to check, prior to setting of the shot layout, consistency between a content of the certain recipe and the shot layout.

6. A computer-readable storage medium which stores a computer-executable program for causing a computer to execute a method of editing parameters of an exposure apparatus for exposing a substrate to radiation based on the parameters, the exposure apparatus including:
- (a) a display; and
- (b) an operation device configured for an operator of the exposure apparatus to execute an input operation to the exposure apparatus, the method comprising:
- (i) selecting, by the operation device, one of a plurality of names of works to be executed by the exposure apparatus and one of a plurality of names of functions, each of which is contained in at least one of the plurality of works;
- (ii) causing the display to simultaneously display the plurality of names of works arranged in a first area along one side of a display area of the display, the plurality of names of functions arranged in a second area along another side of the display area, the one side being orthogonal to the other side, and contents of the parameters for exposing the substrate to be edited, corresponding to a combination of the selected one of the plurality of names of works and the selected one of the plurality of names of functions, arranged in a third area having two sides respectively along the first and second areas; and
- (iii) editing the parameters for exposing the substrate.

7. A computer-readable storage medium which stores a computer-executable program for causing a computer to execute a method of editing parameters of an exposure apparatus for exposing a substrate to radiation based on the parameters, the exposure apparatus including:
- (a) a display; and
- (b) an operation device configured for an operator of the exposure apparatus to execute an input operation to the exposure apparatus, the method comprising:
- (i) causing, in accordance with an indication by the operation device, editing of a shot layout of a certain recipe to be executed by the exposure apparatus;
- (ii) causing the display to simultaneously display, with respect to the certain recipe to be executed by the exposure apparatus, names of shot layouts of a plurality of recipes, the certain recipe and the plurality of recipes corresponding to a common device to be manufactured via exposures by the exposure apparatus; and
- (iii) setting, with respect to the certain recipe to be executed by the exposure apparatus, a shot layout corresponding to one of the displayed names of shot layouts designated by the operation device.

8. A method of manufacturing a device using an exposure apparatus for exposing a substrate to radiation based on parameters, the exposure apparatus including:
- (a) a display;
- (b) an operation device configured for an operator of the exposure apparatus to execute an input operation to the exposure apparatus; and
- (c) a processor configured to execute a program for selecting, by the operation device, one of a plurality of names of works to be executed by the exposure apparatus and one of a plurality of names of functions, each of which is contained in at least one of the plurality of works, and editing the parameters for exposing the substrate, wherein the processor is configured to cause the display to simultaneously display (i) the plurality of names of works arranged in a first area along one side of a display area of the display, (ii) the plurality of names of functions arranged in a second area along another side of the display area, the one side being orthogonal to the other side, and (iii) contents of the parameters for exposing a substrate to be edited, corresponding to a combination of the selected one of the plurality of names of works and the selected one of the plurality of names of functions in a third area having two sides respectively along the first and second areas, the method comprising:
- (i) exposing a substrate to radiation using the exposure apparatus;
- (ii) developing the exposed substrate; and
- (iii) processing the developed substrate to manufacture the device.

9. A method of manufacturing a device using an exposure apparatus for exposing a substrate to radiation based on parameters, the exposure apparatus including:
- (a) a display;
- (b) an operation device configured for an operator of the exposure apparatus to execute an input operation to the exposure apparatus; and
- (c) a processor configured to execute a program for editing the parameters for exposing the substrate, wherein the processor is configured to cause, in accordance with an indication by the operation device, editing of a shot layout of a certain recipe to be executed by the exposure apparatus to cause the display to simultaneously display, with respect to the certain recipe, names of shot layouts of a plurality of recipes, the certain recipe and the plurality of recipes corresponding to a common device to be manufactured via exposures by the apparatus, and to set, with respect to the certain recipe, a shot layout corresponding to one of the displayed names of shot layouts designated by the operation device, the method comprising:
- (i) exposing a substrate to radiation using the exposure apparatus;
- (ii) developing the exposed substrate; and
- (iii) processing the developed substrate to manufacture the device.

* * * * *